United States Patent

Zhang et al.

[11] Patent Number: 5,929,705
[45] Date of Patent: Jul. 27, 1999

[54] CMOS RAIL-TO-RAIL INPUT/OUTPUT AMPLIFIER

[75] Inventors: Michael Y. Zhang, Palo Alto; Ignatius Bezzam, Mountain View, both of Calif.

[73] Assignee: Fairchild Semiconductor Corporation, South Portland, Mass.

[21] Appl. No.: 08/838,109

[22] Filed: Apr. 15, 1997

[51] Int. Cl.$^6$ ........................................ H03F 3/45
[52] U.S. Cl. ............................. 330/253; 330/261
[58] Field of Search ......................... 330/253, 257, 330/261, 252; 327/124

[56] References Cited

U.S. PATENT DOCUMENTS

| | | | |
|---|---|---|---|
| 4,797,631 | 1/1989 | Hsu et al. ........................... | 330/253 |
| 5,293,136 | 3/1994 | Ryat .................................... | 330/253 |
| 5,491,455 | 2/1996 | Kuo ..................................... | 330/253 |
| 5,550,510 | 8/1996 | Nagaraj ............................... | 330/253 |

*Primary Examiner*—Robert Pascal
*Assistant Examiner*—Khanh V. Nguyen
*Attorney, Agent, or Firm*—Skjerven, Morrill, MacPherson, Franklin & Friel LLP

[57] ABSTRACT

A CMOS rail-to-rail input/output operational amplifier has constant supply current with respect to the input signal's common mode voltage. By use of current bleeders, i.e. a smaller transistor of opposite conductivity type connected in parallel with each transistor in the differential pair of transistors, there is provided constant transconductance and constant supply current for rail-to-rail operation with respect to the positive and negative supply voltages. This allows production of a low cost, high performance and small area rail-to-rail input/output operational amplifier.

6 Claims, 4 Drawing Sheets

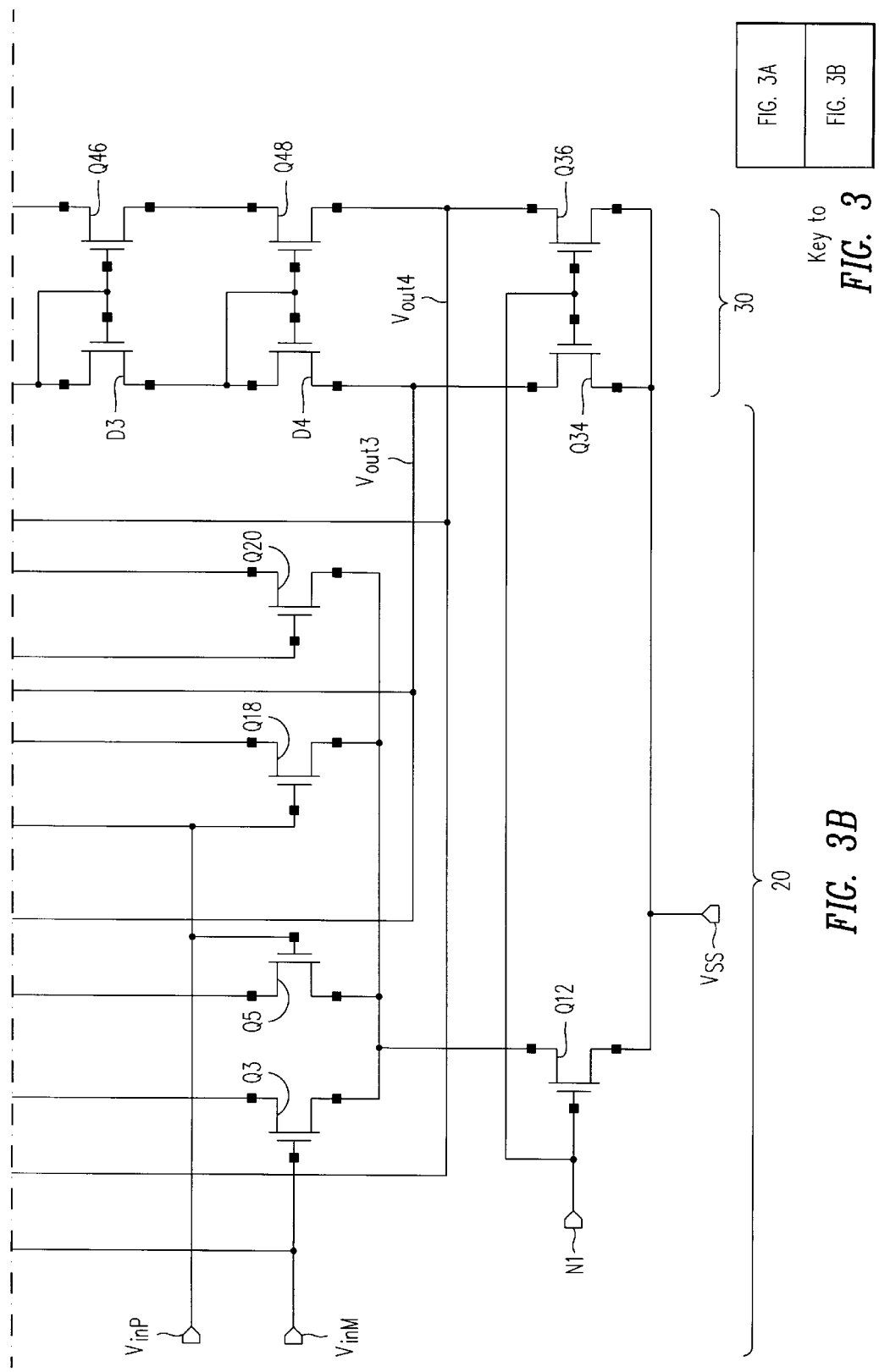

CM OS RAIL-TO-RAIL INPUT/OUTPUT AMPLIFIER

BACKGROUND OF THE INVENTION

1. Field of the Invention

This invention relates to operational amplifiers, and more specifically to a CMOS operational amplifier having good performance rail-to-rail.

2. Description of the Prior Art

This invention relates to rail-to-rail input/output general purpose operational amplifiers ("op amps"). Such amplifiers typically are used widely in the electronics field. It is desirable to have an input stage to such an operational amplifier with full "rail-to-rail" operational range. Rail-to-rail refers to the range from the positive supply voltage (designated VDD) to the negative voltage supply (designated VSS) which is often ground, and in this context refers to the common node voltage of the input signal to the input stage being anywhere within this range.

In the prior art, the input stage of such an operational amplifier is typically as shown in FIG. 1, including a differential pair of P-channel transistors Q2, Q4 and a differential pair of corresponding N-channel transistors Q3, Q5. Typically this is a CMOS integrated circuit hence these are respectively PMOS and NMOS transistors. As can be seen, the positive input signal applied to terminal VINP is coupled to the gates of transistors Q4 and Q5, while the minus input signal applied to terminal VINM is coupled to the gates of transistors Q2 and Q3. As is well known in the application of operational amplifiers in a negative feedback system, the input signals which are applied to input terminals VINP, VINM in FIG. 1 have the same DC voltage component and differ in their AC component. The level of DC voltage of the two input signals is usually called the "common mode" or "common-mode voltage".

There are three basic operating regions of such an input stage. When the common mode voltage is near the negative power supply voltage (the voltage applied to the negative power supply terminal or "rail" VSS), only the P-channel pair of transistors Q2 and Q4 operates, i.e. is conductive. For a common mode voltage near the positive power supply voltage (the voltage applied to the positive power supply terminal or "rail" VDD), only the N-channel pair of transistors Q3 and Q5 operates. For a common mode voltage which is so-called "mid rail", i.e. halfway between the VDD and VSS voltages, both differential pairs Q2, Q4 and Q3, Q5 operate. Therefore the transconductance ($g_m$) can change by a factor of two as the common mode voltage moves from the level of the one power supply voltage to the level of the other i.e., rail-to-rail. (Transconductance is defined as the relationship between current and gate-source voltage for a transistor expressed e.g. as milliamps/volt). This change in transconductance complicates the operational amplifier frequency compensation and other parameters, and hence is recognized as being undesirable.

As seen in FIG. 1, the output signals from this input stage are provided on lines VOUT1, VOUT2, VOUT3 and VOUT4. Also in FIG. 1, control signals P1 and N1 respectively control transistors Q10, Q14, which are current sources supplied by, respectively, the positive and negative voltage supplies.

Prior art operational amplifiers using a circuit like that of FIG. 1, where it is desired to have rail-to-rail functionality, typically use a MOS transistor translinear control circuit to regulate the "tail current" to achieve constant transconductance, or use matching N-channel transistors with P-channel transistors, or a current monitor circuit, to control the transconductance. (Tail current is the current supplied by transistors Q10, Q14.) All these techniques produce somewhat constant transconductance in operation. As the input signal swings from rail-to-rail, the currents supplied by the positive and negative rails change because they are controlled by the translinear circuit. As the currents change, the amount of power drained from the positive and negative rails changes, which in turn is injected as an AC signal into the rails. In other words, as the common mode voltage moves from near the voltage of the positive power supply rail to near the voltage of the negative power supply rail, or vice versa, the supply current is changed in order to keep transconductance constant. However this injects a small AC signal into the power supply lines ("rails") (connected to terminals VDD, VSS) because of the changing supply current. This small AC signal in the power supply rails not only degrades their own power supply rejection ratio (PSRR) but also degrades performance of any other circuits connected to the same power supply rails. Hence the prior art solutions are not adequate.

SUMMARY

In accordance with this invention, rail-to-rail operation of a differential amplifier is provided by use of current bleeders. These current bleeders are transistors which bleed (drain/source) current as desired. This solution advantageously not only avoids the complicated prior art transconductance control circuit, but also desirably achieves a constant current with regard to the common mode voltage. The current bleeders are transistors connected in parallel with each of the differential pairs of transistors. An N-channel bleeder transistor pair is connected in parallel with the P-channel differential pair of transistors, and a P-channel bleeder transistor pair is connected in parallel with the N-channel differential pair of transistors. The current bleeders bleed little or no current when the common mode input voltage is around mid-rail, i.e. between the voltage of the positive and negative power supply, but the current bleeders bleed maximum current when the common mode voltage is at the voltages of either of the positive or negative power supply.

The maximum current the current bleeders draw (bleed) is set by the associated current source, therefore the constant transconductance and constant supply current are preserved. Furthermore, the unity gain bandwidth of the operational amplifier in which this input stage is used is set to its maximum when the common mode voltage is around mid-rail, and equal to the sum of the unity gain bandwidth when the common mode voltage is at the voltage level of either the high or low power supply. This phenomenon indicates that the current bleeders in accordance with this invention dynamically adjust the operational amplifier so it is always at its optimum operating point.

Thus, advantageously the current bleeders in a rail-to-rail operational amplifier achieve constant transconductance and constant power supply current with respect to the common mode voltage. Also, a better PSRR of the operational amplifier results from use of the current bleeders.

DETAILED DESCRIPTION

Figure 1:
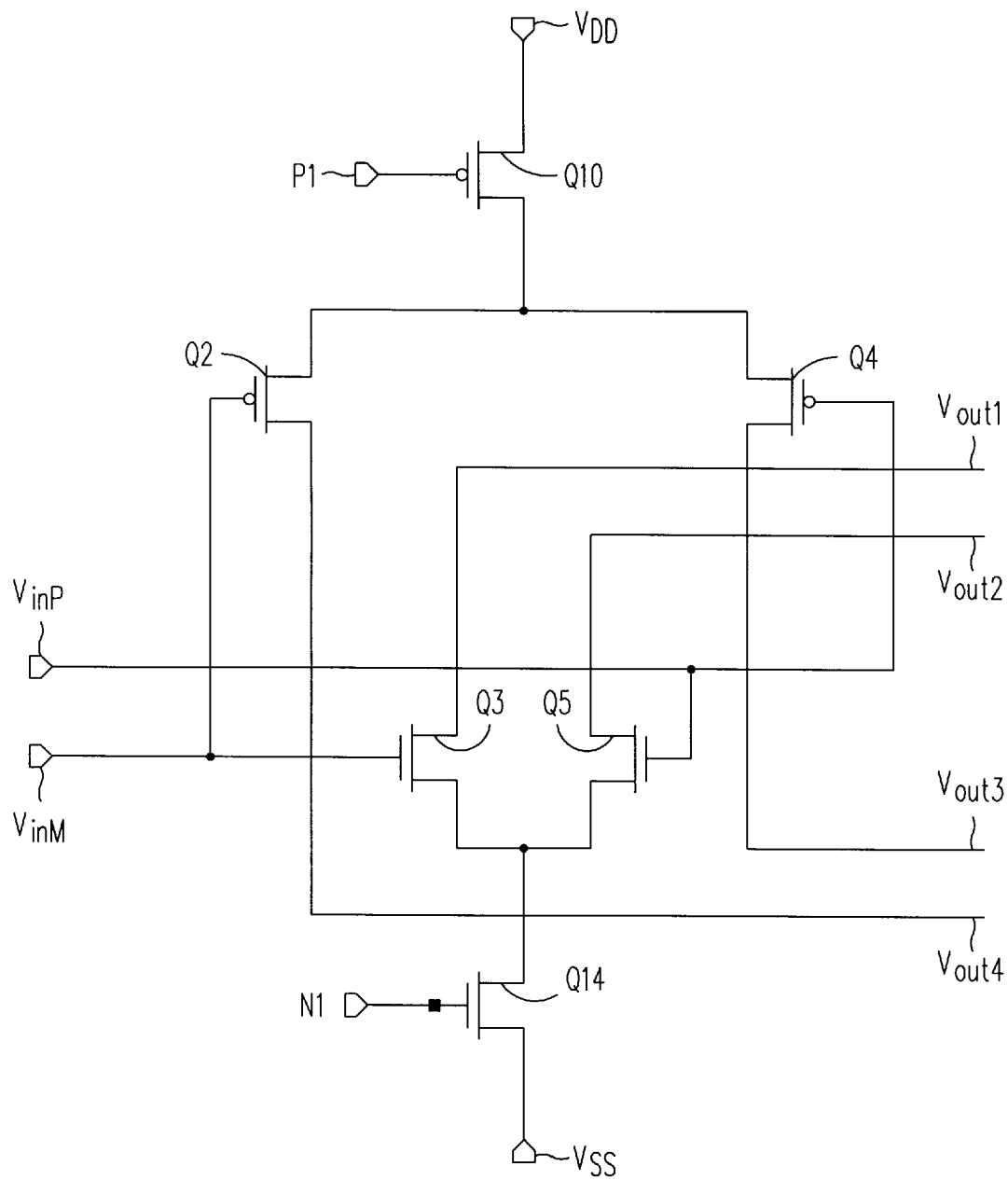
FIG. 1 shows a prior art input stage for an operational amplifier.
Figure 2:
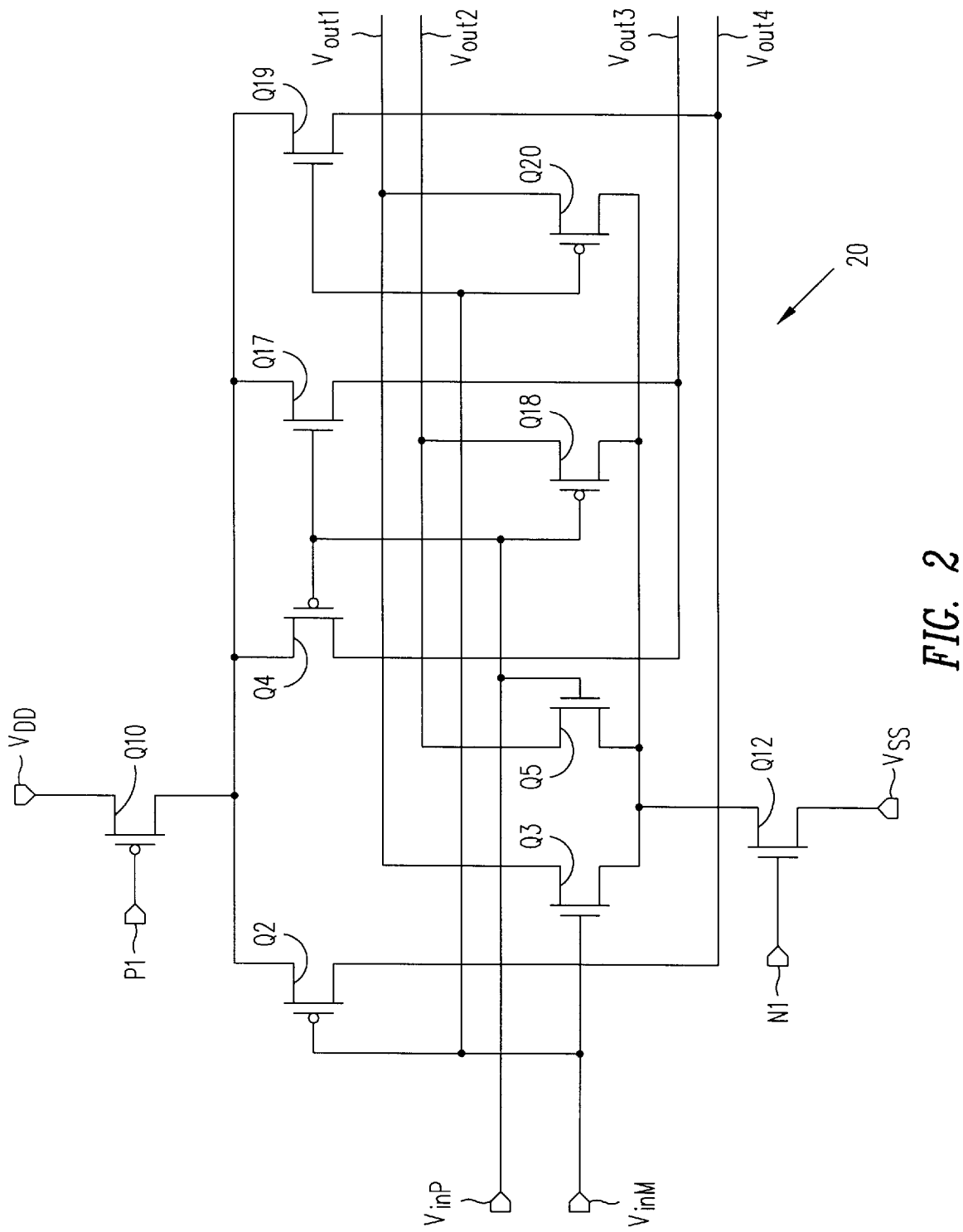
FIG. 2 shows an input stage for an operational amplifier in accordance with this invention.

FIG. 2 shows an input stage 20 for an operational amplifier in accordance with this invention. Each transistor and terminal which has the same reference number as that of the corresponding transistor in the circuit of FIG. 1 denotes a similar element. A difference between the circuit of FIG. 2 and that of FIG. 1 is the addition of the two pairs of current bleeder transistors Q17, Q19 and Q18, Q20. The P-channel (PMOS) current bleeder transistor pair Q18, Q20 is connected in parallel to the N-channel differential pair of transistors Q3 and Q5. Similarly N-channel (NMOS) bleeder transistor pair Q17, Q19 is connected in parallel to the P-channel differential pair of transistors Q2 and Q4. When the common mode input voltage is around mid-rail, i.e. about halfway between the positive power supply voltage applied at terminal VDD and the negative power supply voltage applied at terminal VSS, the bleeder transistors "bleed" (source/drain) little or no current. When the common mode input voltage is near that of voltage VDD however, the two N-channel bleeder transistors Q17 and Q19 are turned on and bleed an appropriate amount of current which is at a maximum when the common mode voltage is at voltage VDD. Conversely, when the common mode voltage is near voltage VSS, this turns on the P-channel bleeder transistors Q18 and Q20 which then bleed a maximum amount of current. The bleeder transistors are in pairs because this is a differential input stage having two input signals applied to respectively input terminals VINP, VINM. Each bleeder transistor bleeds only one-half of the current set by transistors Q10, Q12. The rise of one input signal causes a fall in the other because the current source from the rails is fixed.

Figure 3A:
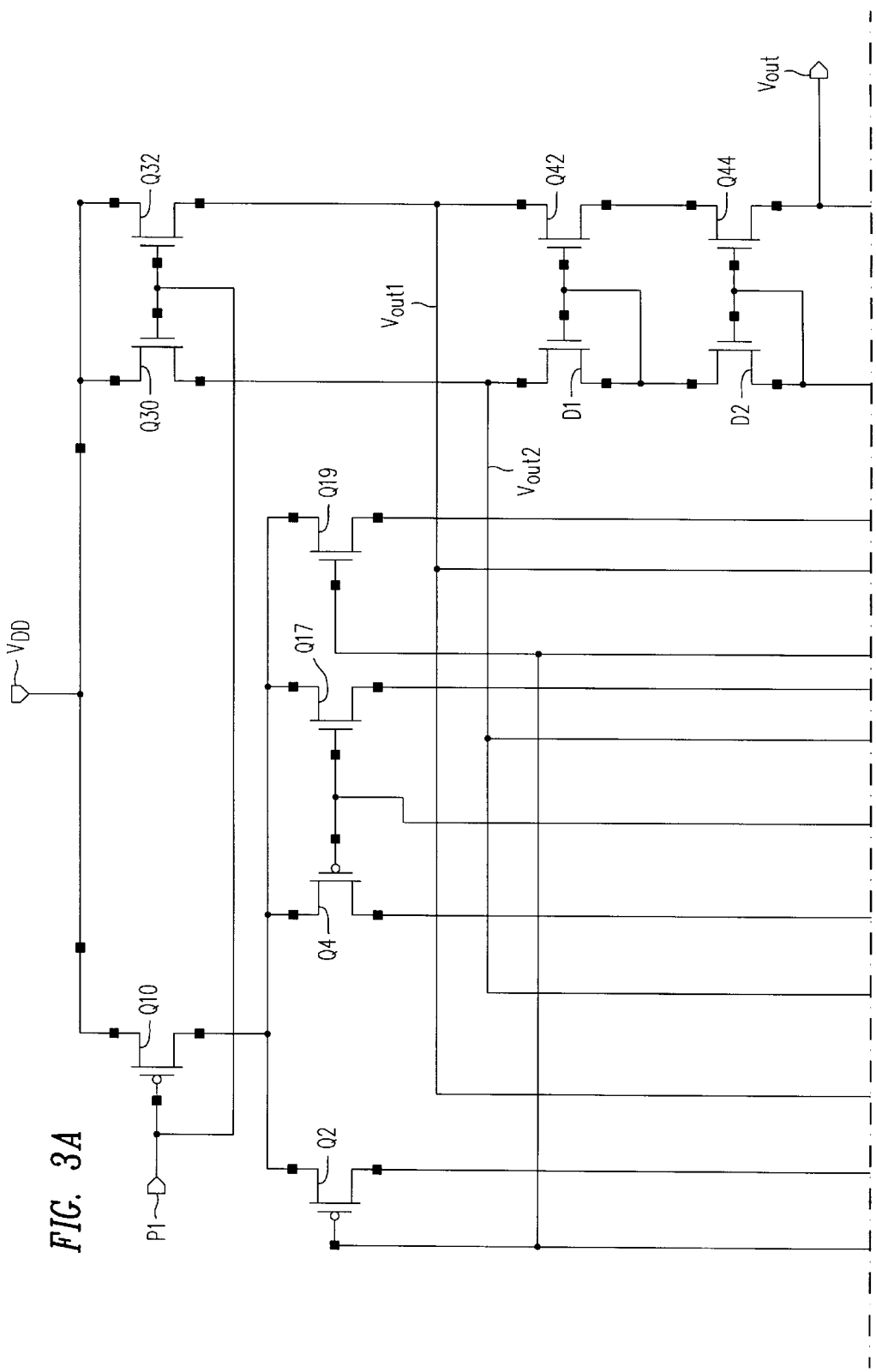
FIG. 3 shows the input stage of FIG. 2 together with an operational amplifier output stage in accordance with this invention.

FIG. 3 shows an entire input/output operational amplifier circuit in accordance with this invention. The input stage 20 of FIG. 2 is shown in the left-hand side of FIG. 3; the right-hand side of FIG. 3 shows an exemplary conventional output stage 30. As shown, the output stage 30 is connected at lines VOUT1, VOUT2, VOUT3, and VOUT4 to the input stage 20. The output stage 30 includes current source transistors. This stage also converts a differential input signal to a single-ended signal VOUT. The current source transistors provide this conversion capability; the current source transistors provide rail-to-rail output operation. Diode connected transistors and output transistors are also in the output stage 30. In this case there is a single output signal VOUT, hence this output stage is a differential to single ended converter stage.

Hence the bleeder transistors Q17, Q19 and Q18, Q20 source/drain excessive current, in order to balance the current provided at the next amplifier stage, which is stage 30 in FIG. 3. The bleeder transistors are preferably smaller in area than the other transistors in the circuit so that they draw less current; the intention is that the bleeder transistors are on (conductive) only when the associated differential transistor pair is off, i.e. not conducting. The bleeder transistors draw negligible current when the common mode voltage is at one half VDD, where VSS is ground (zero volts) and where both differential pairs are fully operational. Advantageously, by drawing a constant current in accordance with this invention by use of the bleeder transistors when the associated differential transistor pair is off, and drawing no current when the associated differential pair is on, noise generation is minimized, advantageously increasing PSRR. Hence advantageously the present invention provides noise reduction and advantageously does so without use of a control circuit as used in the prior art.

While a typical application of the circuits of FIG. 2 or 3 is in an integrated circuit version of an operational amplifier using CMOS technology, of course the circuit can also be constructed of discrete components. Typical applications (especially for the integrated circuit version) are in the portable electronics area, since there is provided a low cost high performance and small area rail-to-rail input/output CMOS operational amplifier.

This disclosure is illustrative and not limiting; further modifications will be apparent to one of ordinary skill in the art in light of this disclosure, and are intended to fall within the scope of the appended claims.

We claim:

1. An amplifier stage comprising:

first and second input terminals coupled respectively to the control terminals of first and second transistors, the first and second transistors being of similar first conductivity type;

a first current handling terminal of each of the first and second transistors being coupled to a first current source;

a second current handling terminal of each of the first and second transistors being an output terminal of the amplifier stage;

a first current bleeder transistor of a second conductivity type having a first current handling terminal coupled to the first current source, a second current handling terminal coupled to the second current handling terminal of the second transistor, and a control terminal coupled to the second input terminal;

a second bleeder transistor of the second conductivity type and having a first current handling terminal coupled to the first current source, a second current handling terminal coupled to the second current handling terminal of the first transistor, and a control terminal coupled to the first input terminal;

third and fourth transistors of the second conductivity type, a first current handling terminal of each of the third and fourth transistors being coupled to a second source of current, and a second current handling terminal of each of the third and fourth transistors being an output terminal of the amplifier stage;

a third current bleeder transistor of the first conductivity type and having a first current handling terminal coupled to the second current source, a second current handling terminal coupled to the second current handling terminal of the third transistor, and a control terminal coupled to the second input terminal; and a fourth current bleeder transistor of the first conductivity type and having a first current handling terminal coupled to the second current source, a second current handling terminal coupled to the second current handling terminal of the fourth transistor, and a control terminal coupled to the first input terminal.

2. The amplifier stage of claim 1, wherein all of the transistors are field effect transistors.

3. The amplifier stage of claim 1, wherein the first and second current bleeder transistors are of smaller area than the first and second transistors.

4. A method of operating a differential amplifier stage having two input terminals and four output terminals driven by two pairs of transistors, comprising the steps of:

when an input signal applied to the input terminals is near a voltage of a positive power supply to the amplifier stage or near a voltage of a negative power supply to the amplifier stage, bleeding a first level of current between two of the output terminals and a current source; and when the input signal is at a voltage midway between the voltages of the positive and negative power supplies, bleeding a second level of current substantially less than the first level between the output terminals and a current source.

5. An amplifier input stage comprising:

two differential pairs of transistors, each pair including two transistors of same conductivity types; and a current bleeder transistor having all three of its terminals connected in parallel to corresponding terminals of each of the transistors in the two differential pairs.

6. The amplifier stage of claim 5, wherein each current bleeder transistor is of opposite conductivity type to and of smaller area than the associated transistor to which it is connected in parallel.

* * * * *

UNITED STATES PATENT AND TRADEMARK OFFICE
CERTIFICATE OF CORRECTION

PATENT NO. : 5,929,705                                    Page 1 of 1
DATED      : July 27, 1999
INVENTOR(S) : Michael Y. Zhang et al.

It is certified that error appears in the above-identified patent and that said Letters Patent is hereby corrected as shown below:

<u>Column 6,</u>
Line 4, delete "a current bleeder transistor" and insert -- four current bleeder transistors each --.
Line 7, delete "each" and insert -- a corresponding one --.

Signed and Sealed this

Twenty-sixth Day of February, 2002

*Attest:*

JAMES E. ROGAN
*Attesting Officer*     *Director of the United States Patent and Trademark Office*